United States Patent
Chen et al.

(10) Patent No.: US 9,111,723 B2
(45) Date of Patent: Aug. 18, 2015

(54) LINEAR PLASMA SOURCE

(71) Applicant: Shenzhen JT Automation Equipment Co., Ltd., Shenzhen (CN)

(72) Inventors: Jiexin Chen, Shenzhen (CN); Zhiming Xu, Shenzhen (CN); Yuee Liu, Shenzhen (CN)

(73) Assignee: SHENZHEN JT AUTOMATION EQUIPMENT CO., LTD, Shenzhen (CN)

( * ) Notice: Subject to any disclaimer, the term of this patent is extended or adjusted under 35 U.S.C. 154(b) by 163 days.

(21) Appl. No.: 13/773,664

(22) Filed: Feb. 22, 2013

(65) Prior Publication Data

US 2014/0217894 A1  Aug. 7, 2014

(30) Foreign Application Priority Data

Feb. 4, 2013  (CN) .......................... 2013 1 0043635

(51) Int. Cl.
*H01J 17/22* (2012.01)
*H01J 37/32* (2006.01)

(52) U.S. Cl.
CPC ......... *H01J 37/32091* (2013.01); *H01J 37/321* (2013.01)

(58) Field of Classification Search
CPC .................................................. H01J 37/3244
USPC ....................................... 315/111.41, 111.21
See application file for complete search history.

(56) References Cited

U.S. PATENT DOCUMENTS

| | | | |
|---|---|---|---|
| 5,503,676 A * | 4/1996 | Shufflebotham et al. ..... | 118/723 MR |
| 5,871,588 A * | 2/1999 | Moslehi et al. ............... | 118/730 |
| 6,137,231 A * | 10/2000 | Anders et al. ............ | 315/111.21 |
| 6,140,773 A * | 10/2000 | Anders et al. ............ | 315/111.21 |
| 6,350,961 B1 * | 2/2002 | Jung ......................... | 219/121.59 |
| 6,388,381 B2 * | 5/2002 | Anders .................... | 315/111.21 |
| 6,418,874 B1 * | 7/2002 | Cox et al. .................... | 118/723 I |

(Continued)

FOREIGN PATENT DOCUMENTS

| CN | 102568990 A | 7/2012 |
|---|---|---|
| KR | 20110131833 A | 12/2011 |
| KR | 20110131834 A | 12/2011 |

OTHER PUBLICATIONS

High Efficient Low Cost Photovoltaics Recent developments Vesselinka Petrova-Koch Publishers Springer 2009 Article by Hazel p. 76,77.*

*Primary Examiner* — Douglas W Owens
*Assistant Examiner* — Srinivas Sathiraju
(74) *Attorney, Agent, or Firm* — Kilpatrick Townsend & Stockton LLP

(57) ABSTRACT

Embodiments of the present application disclose a linear plasma source applied to the field of solar cell production. A linear plasma source comprising a housing which forms a reaction chamber having an outlet; a gas intake system comprising an internal pipeline which is mounted on the housing and located inside the reaction chamber for releasing reaction gas into the reaction chamber; an electrode system comprising at least two electrode plates which are mounted on the housing and located around the internal pipeline within the reaction chamber; and an electromagnetism system comprising an electromagnetic coil, and the electromagnetic coil is mounted at the outlet of the reaction chamber of the housing and has a plasma outlet. The embodiments of the present application have a simple structure, a low production cost, a good uniformity and a high film compactness.

10 Claims, 3 Drawing Sheets

(56) References Cited

U.S. PATENT DOCUMENTS

| | | | |
|---|---|---|---|
| 6,448,721 B2* | 9/2002 | Raitses et al. | 315/501 |
| 6,815,633 B1* | 11/2004 | Chen et al. | 219/121.54 |
| 6,899,054 B1* | 5/2005 | Bardos et al. | 118/723 MW |
| 7,091,412 B2* | 8/2006 | Wang et al. | 174/391 |
| 7,183,229 B2* | 2/2007 | Yamanaka | 438/795 |
| 7,198,699 B2* | 4/2007 | Thomsen et al. | 204/192.12 |
| 7,454,893 B2* | 11/2008 | Bossmann et al. | 60/202 |
| 7,862,646 B2* | 1/2011 | Carruthers et al. | 95/131 |
| 8,236,152 B2* | 8/2012 | Guo et al. | 204/298.23 |
| 8,593,064 B2* | 11/2013 | Chang Diaz | 315/111.61 |
| 8,741,115 B2* | 6/2014 | Yumshtyk et al. | 204/298.16 |
| 8,771,538 B2* | 7/2014 | Lubomirsky et al. | 216/68 |
| 8,821,742 B2* | 9/2014 | Yoshida et al. | 216/67 |
| 8,828,182 B2* | 9/2014 | Detmar et al. | 156/345.1 |
| 2003/0148565 A1* | 8/2003 | Yamanaka | 438/200 |
| 2008/0093506 A1* | 4/2008 | Emsellem et al. | 244/169 |
| 2008/0277265 A1* | 11/2008 | Tsangaris et al. | 204/157.15 |
| 2011/0006040 A1* | 1/2011 | Savas et al. | 216/71 |
| 2011/0114601 A1* | 5/2011 | Lubomirsky et al. | 216/68 |
| 2012/0305450 A1* | 12/2012 | Carruthers et al. | 208/213 |
| 2013/0214684 A1* | 8/2013 | Vasyliev et al. | 315/111.41 |
| 2014/0202385 A1* | 7/2014 | Chen | 118/723.1 |

* cited by examiner

LINEAR PLASMA SOURCE

The present application claims the benefit of priority to Chinese Patent Application No. 201310043635.5 titled "LINEAR PLASMA SOURCE", filed with the Chinese State Intellectual Property Office on Feb. 4, 2013, the entire disclosure of which is incorporated herein by reference.

FIELD OF THE INVENTION

The present application relates to the field of solar cell production, and more particular to a linear plasma source.

BACKGROUND OF THE INVENTION

With the advancement of technology, the application of solar cells is more and more widely, and in the process of film deposition or etching on silicon wafer of the solar cell, a linear plasma source is used to generate plasma for film deposition.

In the prior art, linear plasma source mainly includes hollow cathode plasma source, microwave linear plasma source and so on. The microwave linear plasma source in the prior art has a duct connected to a device generating microwave, the duct is located in a reaction chamber, a device generating magnetic field is mounted in the reaction chamber, the reaction chamber is preloaded with reaction gas, the duct guides microwave into the reaction chamber, such that the reaction gas in the reaction chamber forms plasma, then the reaction gas is discharged outwardly through a plasma outlet under the action of the magnetic field device.

However, the linear plasma source in the prior art has disadvantages that the production cost is high, the process is complicated and the uniformity of the plasma can not be ensured.

SUMMARY OF THE INVENTION

Embodiments of the present application provide a linear plasma source having a simple structure, a low production cost, a good uniformity and a high film compactness.

A linear plasma source includes a housing which forms a reaction chamber having an outlet; a gas intake system including an internal pipeline, and the internal pipeline is mounted on the housing and located inside the reaction chamber for releasing reaction gas into the reaction chamber; an electrode system including at least two electrode plates which are mounted on the housing and located around the internal pipeline within the reaction chamber; and an electromagnetism system including an electromagnetic coil, and the electromagnetic coil is mounted at the outlet of the reaction chamber of the housing and has a plasma outlet.

In the technical solutions provided by embodiments of the present application, the reaction gas released by the internal pipeline is processed by the electrode plates to generate plasma, thus the structure is simple and the production cost is low, and the electrode plates are located around the internal pipeline, such that the generated plasma is more uniform and the production speed is higher, further an effective magnetic field is generated by the electromagnetic coil, which may effectively restrict the direction of movement of the plasma and increase the density of the plasma, such that the plasma being released is uniform and has a greater density, the speed of film deposition or etching is effectively increased, and the compactness of the film is high.

BRIEF DESCRIPTION OF THE DRAWINGS

For more clearly illustrating embodiments of the present application or the technical solution in the prior art, drawings referred to describe the embodiments or the prior art will be briefly described hereinafter. Apparently, the drawings in the following description are only several embodiments of the present application, and for the person skilled in the art other drawings may be obtained based on these drawings without any creative efforts.

DETAILED DESCRIPTION OF THE INVENTION

The technical solutions in the embodiments of the present application will be described clearly and completely hereinafter in conjunction with the drawings in the embodiments of the present application. Apparently, the described embodiments are only a part of the embodiments of the present application, rather than all embodiments. Based on the embodiments in the present application, all of other embodiments, made by the person skilled in the art without any creative efforts, fall into the protection scope of the present application.

The embodiments of the present application provide a linear plasma source which will be described in detail below.

Figure 1:
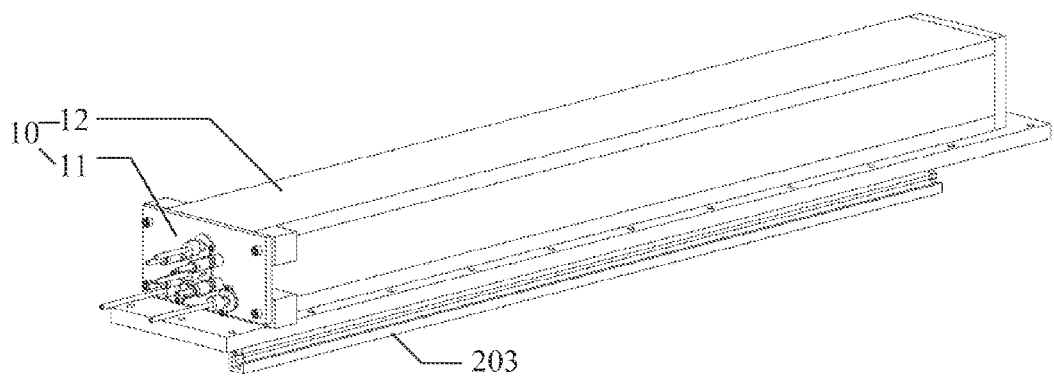
FIG. 1 is a perspective schematic view of a plasma source according to an embodiment of the present application.
Figure 2:
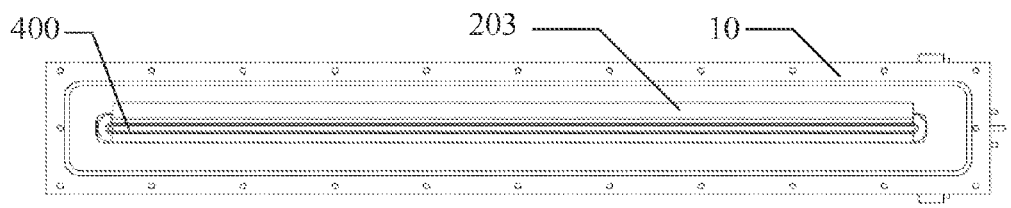
FIG. 2 is a bottom schematic view of the plasma source according to the embodiment of the present application.
Figure 3:
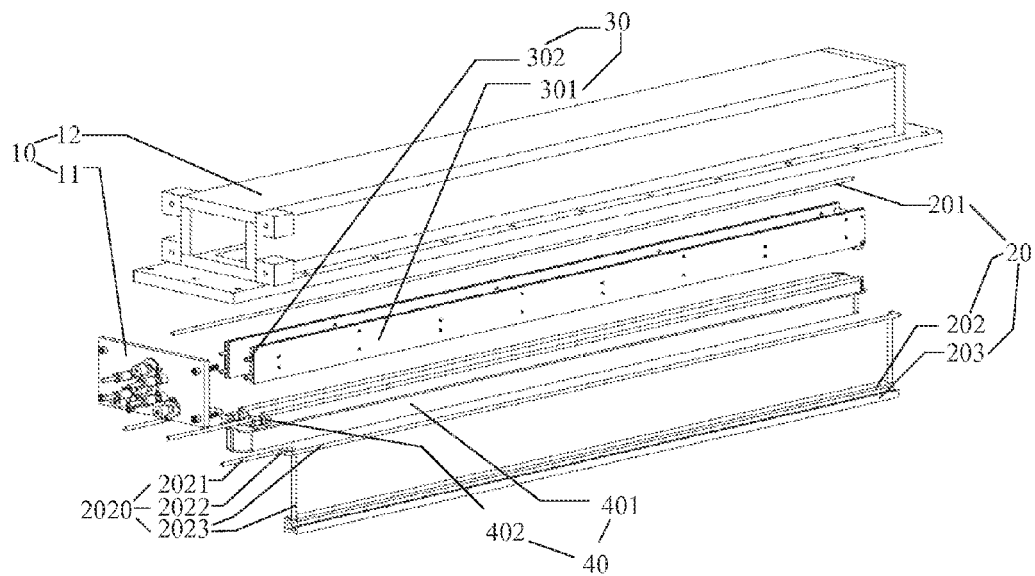
FIG. 3 is a first exploded schematic view of the plasma source according to the embodiment of the present application.
Figure 4:
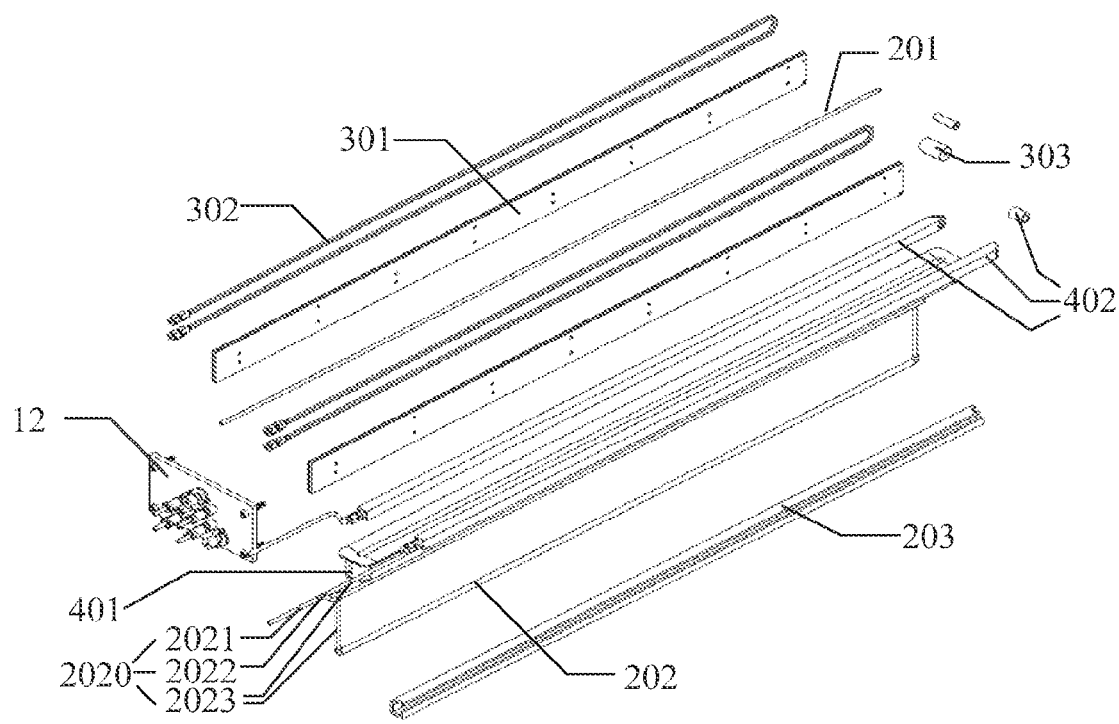
FIG. 4 is a second exploded schematic view of the plasma source according to the embodiment of the present application.
Figure 5:
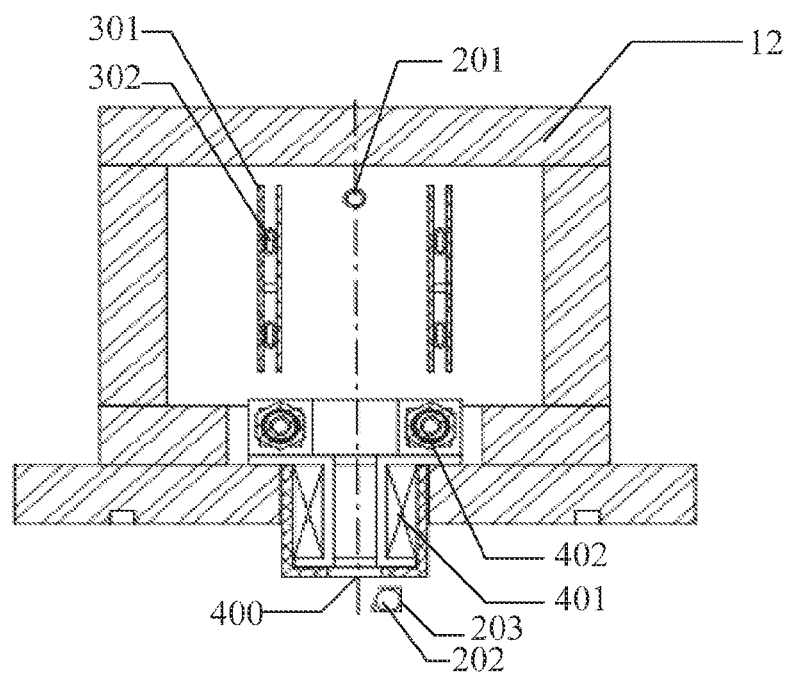
FIG. 5 is a sectional schematic view of the plasma source according to the embodiment of the present application.
Figure 6:
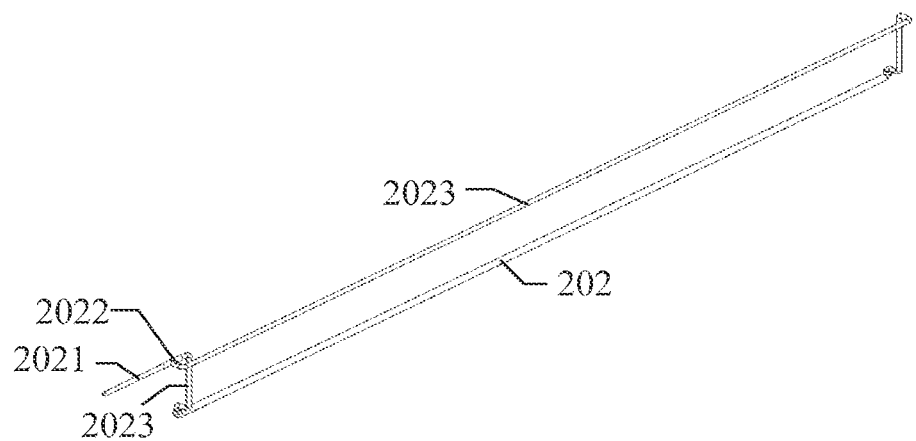
FIG. 6 is a schematic view of a first pipeline system according to the embodiment of the present application.

Referring to FIG. 1 to FIG. 5, FIG. 1 is a perspective schematic view of a plasma source according to an embodiment of the present application; FIG. 2 is a bottom schematic view of the plasma source according to the embodiment of the present application; FIG. 3 is a first exploded schematic view of the plasma source according to the embodiment of the present application; FIG. 4 is a second exploded schematic view of the plasma source according to the embodiment of the present application; and FIG. 5 is a sectional schematic view of the plasma source according to the embodiment of the present application. The plasma source according to the embodiment of the present application includes a housing 10, a gas intake system 20, an electrode system 30 and an electromagnetism system 40.

The housing 10 includes a front cover plate 11 and a housing body 12. A reaction chamber is formed by the front cover plate 11 and the housing body 12, and a lower bottom portion of the housing body 12 has an elongated outlet, such that the housing forms a reaction chamber having an outlet.

The gas intake system 20 includes an internal pipeline 201 and an external pipeline 202.

The internal pipeline 201 is mounted on the housing 10 and located inside the reaction chamber for releasing reaction gas into the reaction chamber. In the present embodiment, specifically, one end of the internal pipeline 201 is fixed onto the front cover plate 11 and is connected with a reaction as source, and the other end of the internal pipeline 201 is fixed to a back portion of the housing body 12. Further, the internal pipeline 201 is mounted on a central axis of the housing 10.

In the present application, the reaction gas includes a process gas which is easy to be ionized and less likely to contaminate the plasma source, and a process gas which is likely to contaminate the plasma source. Specifically, the process gas which is easy to be ionized and less likely to contaminate plasma source is ammonia gas, and the process gas which is likely to contaminate the plasma source is silane. The internal pipeline is used to release the process gas which is easy to be ionized and less likely to contaminate plasma source, and the external pipeline is used to release the process gas which is likely to contaminate the plasma source, and one end of the internal pipeline 201 is connected to a source of the process gas which is easy to be ionized and less likely to contaminate plasma source;

Further, the internal pipeline 201 has a plurality of gas holes, such that the ammonia gas can be easily released from the internal pipeline 201 into the reaction chamber. Specifically, the plurality of gas holes is evenly distributed on the internal pipeline 201.

Because the gas intake system is arranged inside and outside respectively, the process gas which is likely to contaminate the plasma source can be not released into the reaction chamber, such that the adhesion of the plasma in the reaction chamber can be avoid, the maintenance interval of the linear plasma source can be effectively prolonged, and the cleanliness of the cell piece can be increased. In other embodiments, all the reaction gas can be directly released into the reaction chamber through the internal pipeline.

The external pipeline 202 is located below an electromagnetic coil 401 and adjacent to a plasma outlet 400, and is used to release the process gas which is likely to contaminate the plasma source.

Further, the external pipeline 202 is made by metallic porous material.

Further, the gas intake system 20 further includes a U-shaped groove 203 mounted on the housing 10 and used to fix the external pipeline 202, and the U-shaped groove 203 can prevent the external pipeline 202 from being contaminated by the plasma.

Further, the gas intake system further includes a first pipeline system 2020, the first pipeline system includes a first main pipeline 2021 connected with a source of the process gas which is likely to contaminate the plasma source, a tee joint 2022 connected with the first main pipeline 2021, and two first branch pipelines 2023 both connected with the tee joint 2022, and the two first branch pipelines 2023 are respectively connected with a head end and a tail end of the external pipeline 202. Since the holes are evenly distributed on the external pipeline 202 and the gas is fed through both ends of the external pipeline 202, the distribution blind spot of the gas holes can be effectively eliminated such that the gas released by the external pipeline 202 is more uniform.

In the present embodiment, the internal pipeline is fed with gas through only one end. In other embodiments, the gas intake system further includes a second pipeline system, the second pipeline system includes a second main pipeline connected with the source of the process gas which is easy to be ionized and less likely to contaminate plasma source, a tee joint connected with the second main pipeline, and two second branch pipelines connected with the tee joint, and the two second branch pipelines are respectively connected with a head end and a tail end of the internal pipeline.

The electrode system 30 includes at least two electrode plates 301, and the electrode plates 301 are mounted on the housing 10 and are located around the internal pipeline 201 which is in the reaction chamber.

Further, in the present embodiment, the electrode system 30 includes two parallel electrode plates 301 which are located at two sides of the internal pipeline 201. Specifically, the two parallel electrode plates 301 are axisymmetric with respect to a central axis of the housing 10.

Further, the electrode system 30 further includes an electrode water cooling pipeline 302 mounted inside each of the electrode plate 301, which can effectively cool the electrode plates. In the present embodiment, the electrode plate 301 is fixed on the electrode water cooling pipeline 302, and the electrode water cooling pipeline 302 is fixed on the front cover plate 11.

Further, the linear plasma source further includes a low-frequency power supply (not shown) for supplying power to the electrode plates, and a frequency of the low-frequency power supply is ranged from 100 KHz to 500 KHz. In other embodiments, the low frequency power supply can be replaced by a high-frequency power supply, such as a high-frequency power supply having a frequency of 13.56 MHz.

Further, the electrode system 30 further includes a roller wheel 303 mounted between the two parallel electrode plates 301. Since the electrode plates 301 are mounted with the roller wheel, it is more easily to disassemble the electrode plate 301 for replacing with a new electrode plate 301.

In other embodiments, the housing 10 further includes a bracket for fixing the electrode plates 301, and the bracket is connected to the electrode plates and the housing.

By adopting the ionization of the parallel electrode plates, the structure is simple, the manufacturing cost is low, and the formation area and the uniformity of the plasma are increased effectively.

The electromagnetism system 40 includes the electromagnetic coil 401, and the electromagnetic coil 401 is mounted at the outlet of the reaction chamber of the housing 10 and has the plasma outlet 400.

Further, the electromagnetism system 40 further includes an electromagnetism water cooling pipeline 402 mounted at two sides of the electromagnetic coil 401 for effectively cooling the electromagnetic coil 401.

The electromagnetic coil is used to form an effective magnetic field, which may effectively restrict the direction of movement of the plasma and increase the density of the plasma, effectively increase the speed of film deposition or etching, and increase the uniformity of the distribution of plasma in an effective area.

In other embodiments, two or more linear plasma sources can be continuously used on the same device.

Figure 7:
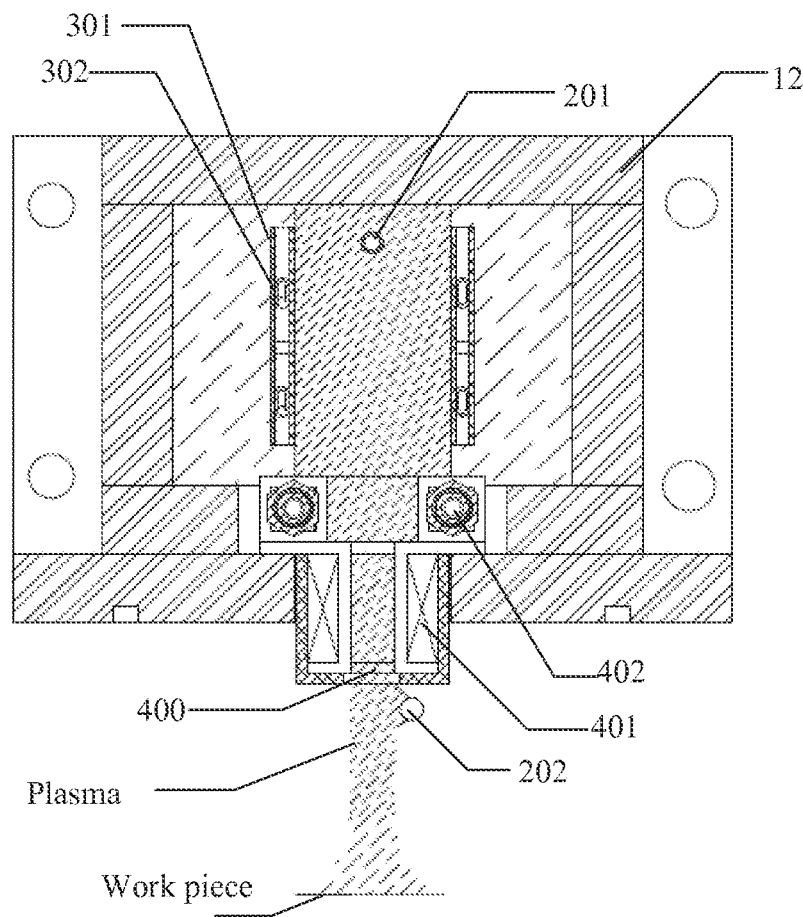
FIG. 7 is a sectional schematic view of the plasma source and the plasma according to the embodiment of the present application.

Referring to FIG. 7, a sectional schematic view of the plasma source and the plasma according to the embodiment of the present application is shown. The internal pipeline 201 spreads the process gas which is easy to be ionized and less likely to contaminate plasma source into the reaction chamber, the electrode plates 301 ionize the process gas into plasma, and under the action of the electromagnetic coil 401, the plasma is kept in the reaction chamber, and when the density of the plasma reaches a certain level, the plasma is emitted through the plasma outlet 400, and the process gas which is likely to contaminate the plasma source is released by the external pipeline 202 to act on a work piece together with the plasma, and the work piece can be a cell piece.

The linear plasma source according to embodiments of the present application has been described in detail hereinabove. The principle and implementation manner of the present application are described herein by specific examples, and the description of the above embodiments is only used to help understanding the method and the core concept of the present application; meanwhile, for those skilled in the art, modifications may be made to the embodiments and the application range based on the concept of the present application. In summary, the content of the present specification should not be considered as limitation to the present application.

The invention claimed is:

1. A linear plasma source comprising:
a housing which forms a reaction chamber having an outlet;
a gas intake system comprising an internal pipeline, wherein the internal pipeline is mounted on the housing and located inside the reaction chamber for releasing reaction gas into the reaction chamber, and the internal pipeline runs through a whole lateral length of the reaction chamber and has a plurality of gas holes;
an electrode system comprising at least two parallel electrode plates mounted within the reaction chamber, wherein the at least two electrode plates are configured for ionizing the reaction gas to generate plasma, the at least two electrode plates are mounted on the housing and located around the internal pipeline within the reaction chamber, and the electrode plates are parallel to the internal pipeline along a direction of the lateral length of the reaction chamber, wherein the direction of the lateral length of the reaction chamber is perpendicular to a direct in which the generated plasma is discharged from the reaction chamber; and
an electromagnetism system comprising an electromagnetic coil, and the electromagnetic coil is mounted at the outlet of the reaction chamber of the housing and has a plasma outlet.

2. The linear plasma source according to claim 1, wherein the gas intake system further comprises:
an external pipeline which is located below the electromagnetic coil and adjacent to the plasma outlet, for releasing a process gas which is likely to contaminate the plasma source; and
the internal pipeline is used to release a process gas which is easy to be ionized and less likely to contaminate plasma source.

3. The linear plasma source according to claim 2, wherein the process gas which is easy to be ionized and less likely to contaminate plasma source is ammonia gas;
the external pipeline is made by metallic porous material, and the process gas which is likely to contaminate the plasma source is silane; and
the gas intake system further comprises a U-shaped groove mounted on the housing and used to fix the external pipeline.

4. The linear plasma source according to claim 1, wherein the electrode system comprises two parallel electrode plates which are located at two sides of the internal pipeline; and
the electrode system further comprises an electrode water cooling pipeline mounted inside each of the electrode plates.

5. The linear plasma source according to claim 1, wherein the electromagnetism system further comprises an electromagnetism water cooling pipeline mounted at two sides of the electromagnetic coil.

6. The linear plasma source according to claim 2, wherein the gas intake system further comprises:
a first pipeline system comprising a first main pipeline connected with a source of the process gas which is likely to contaminate the plasma source, a tee joint connected with the first main pipeline, and two first branch pipelines connected with the tee joint, and the two first branch pipelines are respectively connected with the external pipeline.

7. The linear plasma source according to claim 1, wherein the gas intake system further comprises:
a second pipeline system comprising a second main pipeline connected with a source of the process gas which is easy to be ionized and less likely to contaminate the plasma source, a tee joint connected with the second main pipeline, and two second branch pipelines connected with the tee joint, and the two second branch pipelines are respectively connected with the internal pipeline.

8. The linear plasma source according to claim 2, wherein the gas intake system further comprises:
a second pipeline system comprising a second main pipeline connected with a source of the process gas which is easy to be ionized and less likely to contaminate the plasma source, a tee joint connected with the second main pipeline, and two second branch pipelines connected with the tee joint, and the two second branch pipelines are respectively connected with the internal pipeline.

9. The linear plasma source according to claim 6, wherein the gas intake system further comprises:
a second pipeline system comprising a second main pipeline connected with a source of the process gas which is easy to be ionized and less likely to contaminate the plasma source, a tee joint connected with the second main pipeline, and two second branch pipelines connected with the tee joint, and the two second branch pipelines are respectively connected with the internal pipeline.

10. The linear plasma source according to claim 4, wherein the electrode system further comprises a roller wheel mounted between the two parallel electrode plates.

* * * * *